United States Patent
Liu

(10) Patent No.: US 9,525,075 B2
(45) Date of Patent: Dec. 20, 2016

(54) ARRAY SUBSTRATE, METHOD FOR MANUFACTURING THE SAME, AND DISPLAY DEVICE

(71) Applicant: BOE TECHNOLOGY GROUP CO., LTD., Beijing (CN)

(72) Inventor: Xiang Liu, Beijing (CN)

(73) Assignee: BOE TECHNOLOGY GROUP CO., LTD. (CN)

( * ) Notice: Subject to any disclaimer, the term of this patent is extended or adjusted under 35 U.S.C. 154(b) by 0 days.

(21) Appl. No.: 15/098,398

(22) Filed: Apr. 14, 2016

(65) Prior Publication Data

US 2016/0336453 A1 Nov. 17, 2016

(30) Foreign Application Priority Data

May 13, 2015 (CN) .......................... 2015 1 0243789

(51) Int. Cl.
| | |
|---|---|
| H01L 29/10 | (2006.01) |
| H01L 29/786 | (2006.01) |
| H01L 29/423 | (2006.01) |
| H01L 29/66 | (2006.01) |
| H01L 27/12 | (2006.01) |

(52) U.S. Cl.
CPC ....... *H01L 29/7869* (2013.01); *H01L 27/1225* (2013.01); *H01L 27/1259* (2013.01); *H01L 29/42356* (2013.01); *H01L 29/42376* (2013.01); *H01L 29/42384* (2013.01); *H01L 29/66969* (2013.01); *H01L 29/78696* (2013.01)

(58) Field of Classification Search
CPC .......... H01L 29/7869; H01L 29/42356; H01L 29/42376; H01L 29/42384; H01L 29/66969; H01L 29/78696; H01L 27/1225; H01L 27/1222; H01L 27/1259
USPC ......................................................... 257/43
See application file for complete search history.

(56) References Cited

U.S. PATENT DOCUMENTS 8,803,154 B2 * 8/2014 Kuwabara ........... H01L 27/1225
  257/59
8,952,384 B2 * 2/2015 Choi .................. H01L 29/41733
  257/347

* cited by examiner

*Primary Examiner* — Tu-Tu Ho
(74) *Attorney, Agent, or Firm* — Bakerhostetler LLP

(57) ABSTRACT

An array substrate provided according to the present disclosure may include: a base substrate; a gate electrode and a gate insulating layer sequentially formed on the base substrate; a semiconductor layer formed on the base substrate on which the gate insulating layer has been formed; and a source electrode and a drain electrode formed on the base substrate on which the semiconductor layer has been formed. The semiconductor layer may be connected to the source electrode and the drain electrode respectively. A first connection region in which a first connection point is located may be arranged between the semiconductor layer and the source electrode. And a second connection region in which a second connection point is located may be arranged between the semiconductor layer and the drain electrode. A length of a shortest distance on the semiconductor layer from the first connection point to the second connection point may be no less than a reference distance which refers to a longest distance of a straight line between any two points among all points on a perimeter of the gate electrode.

20 Claims, 7 Drawing Sheets

ARRAY SUBSTRATE, METHOD FOR MANUFACTURING THE SAME, AND DISPLAY DEVICE

CROSS-REFERENCE TO RELATED APPLICATION

This application claims the benefit and priority of a Chinese Patent Application No. 201510243789.8 filed on May 13, 2015, the disclosure of the above application is incorporated herein by reference.

FIELD

The present disclosure relates to the field of display technology, in particular to an array substrate, a method for manufacturing the same and a display device.

BACKGROUND

This section provides background information related to the present disclosure which is not necessarily prior art.

A TFT-LCD (Thin Film Transistor Liquid Crystal Display) has advantages such as small volume, low power consumption, no radiation etc., which thus dominates the current tablet display market.

A metallic oxide TFT is a technique emerging in recent years, which has a large On-state current, a high mobility, a good uniformity, transparency, and a simple manufacturing process. The metallic oxide TFT can better satisfy requirements for a large size LCD (Liquid Crystal Display) and active and organic electroluminescent, which thus attracts people's attention. The On-state current of the metallic oxide TFT is 50 times more than that of an amorphous silicon (a-Si) TFT, and an Off-state current is generally between $10^{-11}$ A and $10^{-12}$ A. In a static picture, a low refresh rate is used by the metallic oxide TFT, which may significantly reduce the power consumption.

Inventors, when implementing the present disclosure, found that there is at least a disadvantage with the above approach in that with the current Off-state current, a voltage applied across pixels of the LCD cannot be maintained under the low refresh rate (e.g., 1 Hz).

SUMMARY

This section provides a general summary of the disclosure, and is not a comprehensive disclosure of its full scope or all of its features.

In order to solve the problem with the conventional solutions in which with the current Off-state current, the voltage applied across the pixels of the LCD cannot be maintained under the low refresh rate, embodiments of the present disclosure provide an array substrate, a method for manufacturing the same and a display device.

According to a first aspect of the present disclosure, an array substrate is provided. The array substrate may include: a base substrate; a gate electrode and a gate insulating layer sequentially formed on the base substrate; a semiconductor layer formed on the base substrate on which the gate insulating layer has been formed; and a source electrode and a drain electrode formed on the base substrate on which the semiconductor layer has been formed. The semiconductor layer may be connected to the source electrode and the drain electrode respectively. A first connection region in which a first connection point is located may be arranged between the semiconductor layer and the source electrode. And a second connection region in which a second connection point is located may be arranged between the semiconductor layer and the drain electrode. A length of a shortest path on the semiconductor layer from the first connection point to the second connection point may be no less than a reference distance which refers to a longest distance of a straight line between any two points among all points on a perimeter of the gate electrode.

Alternatively, projections of the semiconductor layer and the gate electrode on the base substrate may have an overlapped area which is less than a projection area of the gate electrode on the base substrate.

Alternatively, when the gate electrode is of a rectangle, a shortest distance on the semiconductor layer from the first connection point to the second connection point may be longer than any of edges of the rectangle.

Alternatively, when the gate electrode is of a circle, a shortest distance on the semiconductor layer from the first connection point to the second connection point may be longer than a diameter of the circle.

Alternatively, when the gate electrode is of an ellipse, a shortest distance on the semiconductor layer from the first connection point to the second connection point may be longer than a length of a major axis of the ellipse.

Alternatively, when the gate electrode is of a rectangle and the semiconductor layer between the first connection point and the second connection point is of a strip shape, a length direction of the strip may be substantially in parallel with a corresponding diagonal of the rectangle.

Alternatively, the semiconductor layer between the first connection point and the second connection point may be of a U-like shape.

Alternatively, the semiconductor layer between the first connection point and the second connection point may be narrower at two ends and wider in middle.

Alternatively, the semiconductor layer may be a metallic oxide semiconductor layer.

Alternatively, the array substrate may further include: an etch stopping layer (ESL) formed on the base substrate on which the semiconductor layer has been formed. And contact via-holes may be respectively formed at locations on the ESL corresponding to the first connection region and the second connection region. And the semiconductor layer may be connected to the source electrode through the contact via-hole of the first connection region, while the semiconductor layer may be connected to the drain electrode through the contact via-hole of the second connection region.

According to a second aspect of the present disclosure, a method of manufacturing an array substrate is provided. The method may include steps of: forming a gate electrode and a gate insulating layer sequentially on a base substrate; forming a semiconductor layer on the base substrate on which the gate insulating layer has been formed; and forming a source electrode and a drain electrode on the base substrate on which the semiconductor layer has been formed. The semiconductor layer may be connected to the source electrode and the drain electrode respectively. A first connection region in which a first connection point is located may be arranged between the semiconductor layer and the source electrode, while a second connection region in which a second connection point is located may be arranged between the semiconductor layer and the drain electrode. A length of a shortest distance on the semiconductor layer from the first connection point to the second connection point may be no less than a reference distance which refers to a longest distance of a straight line between any two points among all points on a perimeter of the gate electrode.

Alternatively, when the gate electrode is of a rectangle and the semiconductor layer between the first connection point and the second connection point may be of a strip shape, and a length direction of the strip may be substantially in parallel with a corresponding diagonal of the rectangle.

Alternatively, the semiconductor layer between the first connection point and the second connection point may be of a U-like shape.

Alternatively, the semiconductor layer between the first connection point and the second connection point may be narrower at two ends and wider in middle.

Alternatively, the step of forming the semiconductor layer on the base substrate on which the gate insulating layer has been formed may include: forming a metallic oxide semiconductor layer on the base substrate on which the gate insulating layer has been formed.

Alternatively, before the step of forming the source electrode and the drain electrode on the base substrate on which the semiconductor layer has been formed, the method may further include: forming an etch stopping layer (ESL) on the base substrate on which the semiconductor layer has been formed; and forming contact via-holes respectively at locations on the ESL corresponding to the first connection region and the second connection region by a patterning process, so that the semiconductor layer is connected to the source electrode through the contact via-hole of the first connection region, and connected to the drain electrode through the contact via-hole of the second connection region.

According to a third aspect of the present disclosure, a display device is provided. The display device may include any of array substrates provided in the first aspect.

The technical solutions of the present disclosure may include beneficial effects as follows.

By increasing a distance between the source electrode and the drain electrode to increase resistance between the source electrode and the drain electrode and thus to reduce the Off-state current, the problem with the conventional solutions in which with the current Off-state current, the voltage applied across the pixels of the LCD cannot be maintained under the low refresh rate can be solved. A good effect of the voltage applied across the pixels of the LCD being able to be maintained even under the low refresh rate may be achieved, while the size of the TFT may be efficiently reduced to improve an aperture ratio.

It should be appreciated that the above general description and the following description in detail are only exemplary and illustrative, and the present disclosure cannot be limit to these.

Further aspects and areas of applicability will become apparent from the description provided herein. It should be understood that various aspects of this disclosure may be implemented individually or combination with one or more other aspects. It should also be understood that the description and specific examples herein are intended for purposed of illustration only and are not intended to limit the scope of the present disclosure.

BRIEF DESCRIPTION OF THE DRAWINGS

In order to clearly illustrate embodiments of the present disclosure or technical solutions in the prior art, the drawings used for description of the embodiments or the conventional solutions will be briefly introduced hereinafter. Obviously, the drawings only concern some of the embodiments of the present disclosure. The skilled in the art may obtain other drawings based on the drawings below without creative labor.

DETAILED DESCRIPTION OF THE PREFERRED EMBODIMENTS

Figure 1:
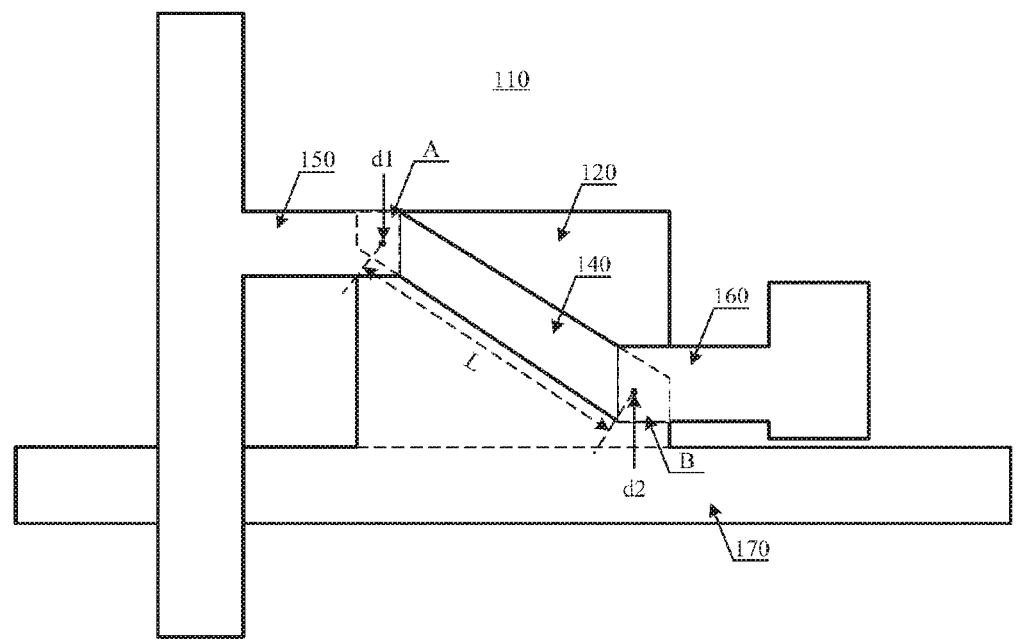
FIG. 1 is a schematic structure diagram of an array substrate according to an exemplary embodiment of the present disclosure.

Hereinafter, particular implementations of the present disclosure will be described in detail in conjunction with the drawings and the embodiments. The embodiments below are only used for illustration, but not limitations on the scope of the present disclosure.

In order to make the objects, the technical solutions and the advantages of the present disclosure more apparent, the present disclosure will be described hereinafter in a clear and complete manner in conjunction with the drawings and embodiments. Obviously, the following embodiments are merely a part of, rather than all of, the embodiments of the present disclosure, and based on these embodiments, a person skilled in the art may obtain the other embodiments, which also fall within the scope of the present disclosure.

Unless otherwise defined, any technical or scientific terms used herein shall have the common meaning understood by a person of ordinary skills. Such words as "first" and "second" used in the specification and claims are merely used to differentiate different components rather than to represent any order, number or importance. Similarly, such words as "one" or "one of" are merely used to represent the existence of at least one member, rather than to limit the number thereof. Such words as "connect" or "connected to" may include electrical connection, direct or indirect, rather than being limited to physical or mechanical connection. Such words as "on/above", "under/below", "left" and "right" are merely used to represent relative position relationship, and when an absolute position of an object is changed, the relative position relationship will be changed too.

Herein, exemplary embodiments will be illustrated in detail, which are shown in the drawings. Hereinafter, unless otherwise indicated, same reference numbers in different drawings indicate identical or similar elements. Implementations as described in the following exemplary embodiments do not cover all of embodiments complying with the present disclosure. On the contrary, they are only examples of apparatuses and methods complying with some aspects of the present disclosure as defined in the appended claims.

Figure 2:
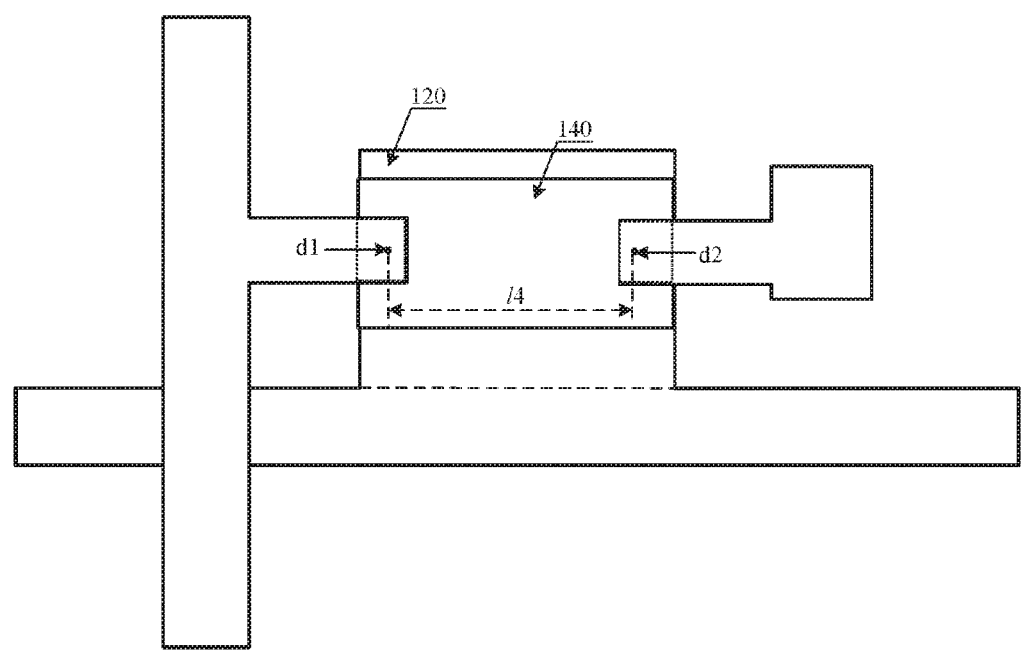
FIG. 2 is a schematic structure diagram of an array substrate in the related art.
Figure 3:
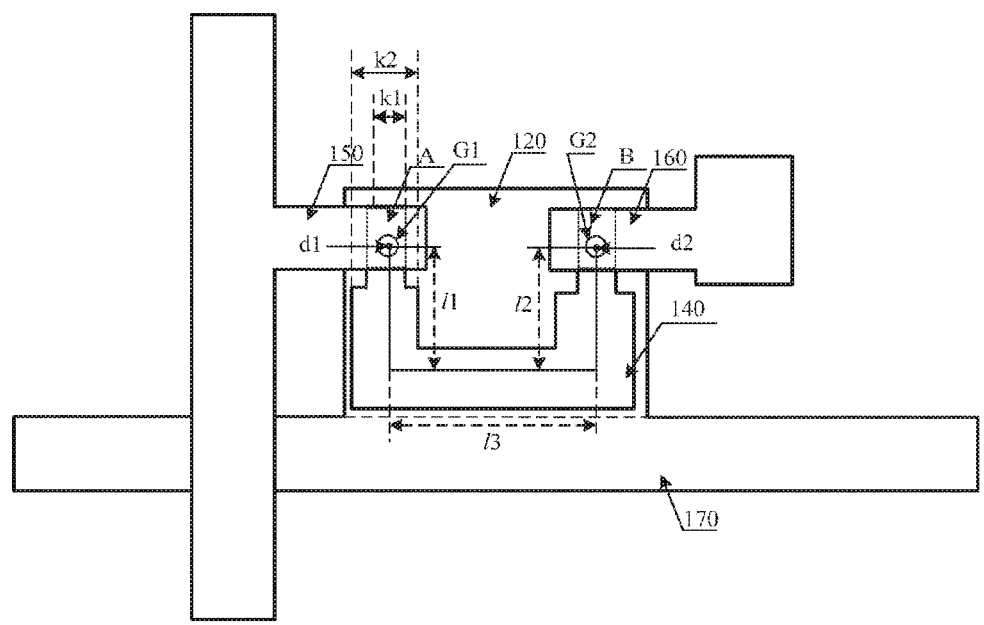
FIG. 3 is a schematic structure diagram of another array substrate according to an exemplary embodiment of the present disclosure.

FIG. 1 is a schematic structure diagram of an array substrate according to an exemplary embodiment of the present disclosure. The array substrate may include: a base substrate 110; a gate electrode 120 and a gate insulating layer (not shown in FIG. 1) sequentially formed on the base substrate 110; a semiconductor layer 140 formed on the base substrate 110 on which the gate insulating layer has been formed; a source electrode 150 and a drain electrode 160 formed on the base substrate 110 on which the semiconductor layer 140 has been formed. The semiconductor layer 140 is connected to the source electrode 150 and the drain electrode 160 respectively. A first connection region indicated by a sign "A" (a contact region between the semiconductor 140 and the source electrode 150) in which a first connection point d1 is located is arranged between the semiconductor layer 140 and the source electrode 150, and a second connection region indicated by another sign "B" (a contact region between the semiconductor 140 and the drain electrode 160) in which a second connection point d2 is located is arranged between the semiconductor layer 140 and the drain electrode 160. A length of a shortest path on the semiconductor layer 140 from the first connection point d1 to the second connection point d2 is no less than a reference distance which refers to a longest distance of a straight line between any two points among all points on a perimeter of the gate electrode 120. Here, as shown in FIGS. 1 to 3, the perimeter of the gate electrode 120 refers to an outline of the gate electrode 120. The purpose of such a design is to increase a length of a channel within a limited area. Here, the channel refers to a region of the semiconductor layer which corresponds to the source electrode and the drain electrode. As shown in FIG. 3, the length of the shortest path on the semiconductor layer 140 from the first connection point d1 to the second connection point d2 may be a sum of three segments, i.e., l1+l2+l3. In addition, projection areas of the semiconductor layer 140 and the gate electrode 120 on the base substrate 110 have an overlapped area which is less than the projection area of the gate electrode 120 on the base substrate 110. Exemplarily, when the gate electrode 120 is of a rectangle, L is longer than any of edges of the rectangle. Alternatively, when the gate electrode 120 is of a circle, L is longer than a diameter of the circle. Alternatively, when the gate electrode 120 is of an ellipse, L is longer than a length of a major axis of the ellipse. The gate electrode 120 may also include a gate scan line 170.

In view of the foregoing, the array substrate provided by the embodiment of the present disclosure solves the problem with the conventional solutions in which with the current Off-state current, the voltage applied across the pixels of the LCD cannot be maintained under the low refresh rate, by increasing the distance between the source electrode and the drain electrode to increase the resistance between the source electrode and the drain electrode and thus to reduce the Off-state current. The good effect of the voltage applied across the pixels of the LCD being able to be maintained even under the low refresh rate may be achieved. Also, the size of the TFT may be efficiently reduced to improve the aperture ratio.

As should be noted, a schematic structure diagram of an array substrate in the related art is shown in FIG. 2. It may be clearly seen from FIG. 2 that in the relate art, a distance l4 on the semiconductor layer 140 from the first connection point d1 to the second connection point d2 is generally no longer than the length of the edge of the gate electrode 120.

Further, with reference to FIG. 3 which is a schematic structure diagram of another array substrate according to an exemplary embodiment of the present disclosure, an optional structure is added to the array substrate of FIG. 3 based on the array substrate of FIG. 1, which enables the array substrate provided by the present embodiment of the present disclosure to have better performance.

Alternatively, the semiconductor layer 140 between the first connection point d1 and the second connection point d2 is of a U-like shape. With an externally applied electric field, a channel capable of transmitting electric energy may be formed on the semiconductor layer 140 between the first connection point d1 and the second connection point d2. As seen from FIG. 3, a length of the channel on the semiconductor layer 140 may be l1+l2+l3, i.e., the semiconductor layer 140 in the U-like shape can significantly increase the length of the channel. The longer the channel is, the larger the resistance between the source electrode and the drain electrode is, and thus the less the Off-state current between the source electrode and the drain electrode is. The less the Off-state current is, the easier it is to maintain the voltage applied across the pixels of the LCD. In FIG. 3, the gate scan line 170 and the gate electrode 120 are formed on the same layer and are electrically connected.

Alternatively, the semiconductor layer 140 between the first connection point d1 and the second connection point d2 is narrower at two ends and wider in middle. That is, a width k1 of the first connection region A and the second connection region B is less than a width k2 of other positions of the semiconductor layer 140. Such a shape can reduce an area of the first connection region A connected between the source electrode 150 and the semiconductor layer 140 and reduce an area of the second connection region B connected between the drain electrode 160 and the semiconductor layer 140. Thus, the resistance between the source electrode 150 and the drain electrode 160 may be increased, and the Off-state current may be reduced accordingly. As such, the array substrate provided by the present embodiment of the present disclosure can use a lower refresh rate to reduce energy consumption for the static picture. In addition, reduction of the areas of the first connection region A and the second connection region B may reduce parasitic capacitance Cgs between the source electrode and the gate electrode and parasitic capacitance Cgd between the drain electrode and the gate electrode, and thus reduce energy consumption of the TFT.

Alternatively, an etch stopping layer (not shown in FIG. 3) is formed on the base substrate 110 on which the semiconductor layer 140 has been formed. The etch stopping layer may protect the semiconductor layer 140.

Contact via-holes are respectively formed at locations on the etch stopping layer corresponding to the first connection region A and the second connection region B. The semiconductor layer 140 is connected to the source electrode 150 through the contact via-hole G1 of the first connection region A, and the semiconductor layer 140 is connected to the drain electrode 160 through the contact via-hole G2 of the second connection region B.

Alternatively, the semiconductor layer 140 is a metallic oxide semiconductor layer. For example, the semiconductor layer may be made of IGZO (Indium Gallium Zinc Oxide), HIZO (Hafnium Indium Zinc Oxide), IZO (Indium Zinc Oxide), ZnO:Al or other metallic oxides.

Alternatively, the shape of the semiconductor layer 140 may also be as shown in FIG. 1, in which the gate electrode 120 is of a rectangle, the semiconductor layer 140 between the first connection point d1 and the second connection point d2 is of a strip shape, and a length direction of the strip is substantially in parallel with a corresponding diagonal of the rectangle. That is, the semiconductor layer 140 may be obliquely oriented to be formed on a region over the gate electrode 120 (in a vertical direction on paper), so as to increase the distance on the semiconductor 140 from the first connection point d1 to the second connection point d2.

Figure 4:
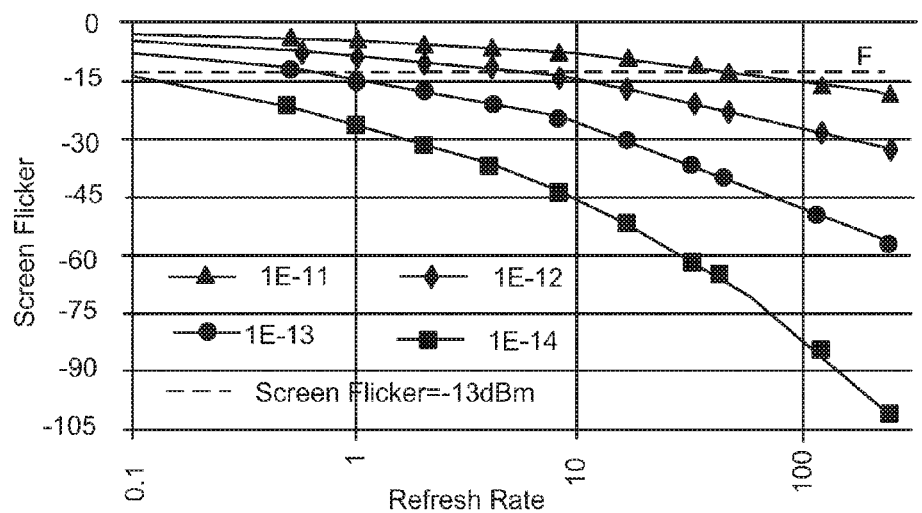
FIG. 4 is a schematic graph showing variation trends of an Off-state current, a refresh rate and a flicker.

Since the lower refresh rate is used for the static picture, the power consumption may be significantly reduced. However, a screen flicker may be increasingly augmented as the refresh rate is reduced. The flicker follows a flicker calculation formula, which is represented as:

$$\text{Flicker} = -16.3 \times \left\{ \frac{(C_{st} + C_{LC}) \times Frq}{i_{Leak}} \right\}^{0.245}$$

where $C_{LC}$ is liquid crystal capacitance, Frq is a refresh rate, $C_{st}$ is storage capacitance, and $i_{Leak}$ is an Off-state current. When the liquid crystal capacitance $C_{LC}$ and the storage capacitance $C_{st}$ of the array substrate provided by the present embodiment of the present disclosure are constant, variation trends of the Off-state current $i_{Leak}$, the refresh rate Frq and the screen flicker Flicker may be as shown in FIG. 4, in which a vertical axis represents the screen flicker Flicker, a horizontal axis represents the refresh rate Frq, each of curves represents a respective Off-state current value; and a unit of the refresh rate Frq is Hz, a unit of the Off-state current $i_{Leak}$ is A, and a unit of the screen flicker Flicker is dBm. Since it is generally required that Flicker<−13 dBm so as to avoid a too high flicker from affecting a display effect, values under a dashed line F in FIG. 4 may meet the requirement. Similarly, FIG. 4 may be represented in a table, as shown in Table 1.

TABLE 1

| Frq | $i_{Leak}$ | | | |
|---|---|---|---|---|
| | 1E-11 | 1E-12 | 1E-13 | 1E-14 |
| | Flicker | | | |
| 1 | −4.83 | −8.50 | −14.94 | −26.26 |
| 10 | −8.50 | −14.94 | −26.26 | −46.16 |
| 30 | −11.12 | −19.55 | −34.37 | −60.41 |
| 60 | −13.18 | −23.17 | −40.73 | −71.60 |

In Table 1, the unit of the refresh rate Frq is Hz, the unit of the Off-state current $i_{Leak}$ is A, the unit of the screen flicker Flicker is dBm, and 1E-n represents -nth power of 1. As clearly seen from Table 1, the array substrate provided by the present embodiment of the present disclosure can control the Off-state current under 1E-13 A in a case that the refresh rate is 1 Hz and the screen flicker Flicker<−13 dBm is maintained. For example, the second row and the third column of Table 1 shows that the refresh rate is 1 Hz, the screen flicker is −14.94 dBm, and the Off-state current is only 1E-13 A. However, the Off-state current $i_{Leak}$ in the relate art is between 1E-11 A and 1E-12 A. Thus, the array substrate provided by the present embodiment of the present disclosure can reduce the Off-state current $i_{Leak}$ by 1 to 3 orders of magnitude.

It should be supplemented that according to the array substrate provided by the present embodiment of the present disclosure, the TFT size is less, and the area of the corresponding semiconductor layer is less. Further, the less the area of the metallic oxide semiconductor layer is, the less the influence of lights on the metallic oxide semiconductor layer is. Thus, an effect of reducing the influence of the lights on the metallic oxide semiconductor layer may be achieved.

It should also be supplemented that the array substrate provided by the present embodiment of the present disclosure increases the resistance between the source electrode and the drain electrode by reducing the area of the first connection region connected between the source electrode and the semiconductor layer and reducing the area of the second connection region connected between the drain electrode and the semiconductor layer, and thus the effect of reducing the Off-state current may be achieved.

In view of the foregoing, the array substrate provided by the embodiment of the present disclosure solves the problem with the conventional solutions in which with the current Off-state current, the voltage applied across the pixels of the LCD cannot be maintained under the low refresh rate, by increasing the distance between the source electrode and the drain electrode to increase the resistance between the source electrode and the drain electrode and thus to reduce the off-state current. The effect of the voltage applied across the pixels of the LCD being able to be maintained even under the low refresh rate may be achieved. Also, the size of the TFT may be efficiently reduced to improve the aperture ratio.

Figure 5:
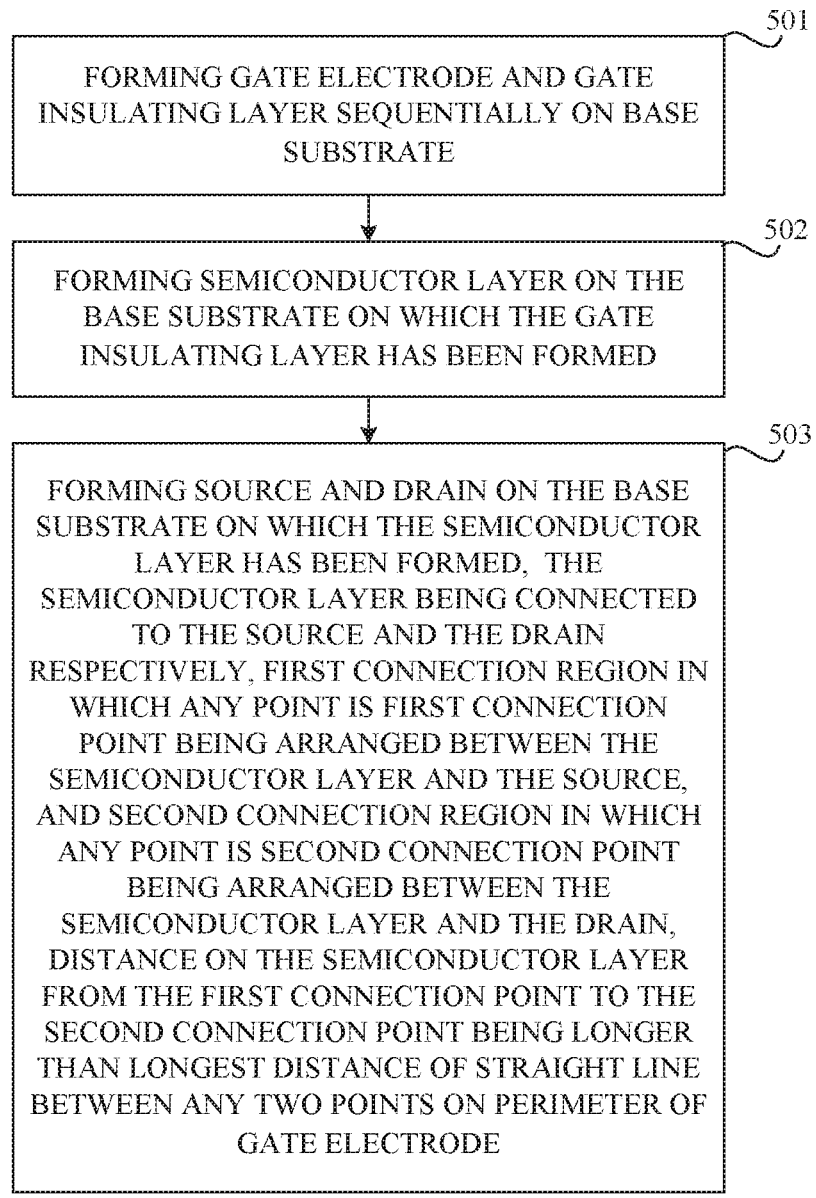
FIG. 5 is a flowchart of a method for manufacturing an array substrate according to an exemplary embodiment of the present disclosure.

FIG. 5 is a flowchart of a method for manufacturing an array substrate according to an exemplary embodiment. The method for manufacturing an array substrate may include following steps.

In step 501, a gate electrode and a gate insulating layer are formed sequentially on a base substrate, the gate electrode including a plurality of gate electrodes.

Figure 6:
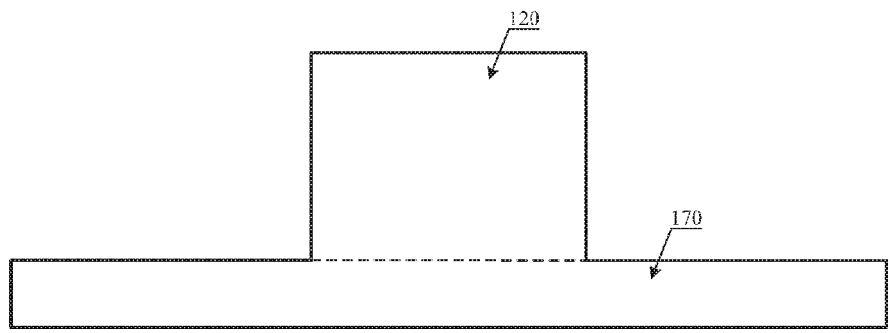
FIGS. 6, 7 and 8 are schematic structure diagrams of array substrates manufactured by the embodiment of the method for manufacturing the array substrate as shown in FIG. 5.

After step 501 ends, the structure of the base substrate 110 may be shown in FIG. 6, in which the gate electrode 120 is formed on the base substrate 110, the gate scan line 170 and the gate electrode 120 are formed on the same layer and are electrically connected. The gate insulating layer is not shown in FIG. 6 in order to clearly show the gate electrode 120.

In step 502, a semiconductor layer is formed on the base substrate on which the gate insulating layer has been formed.

Figure 7:
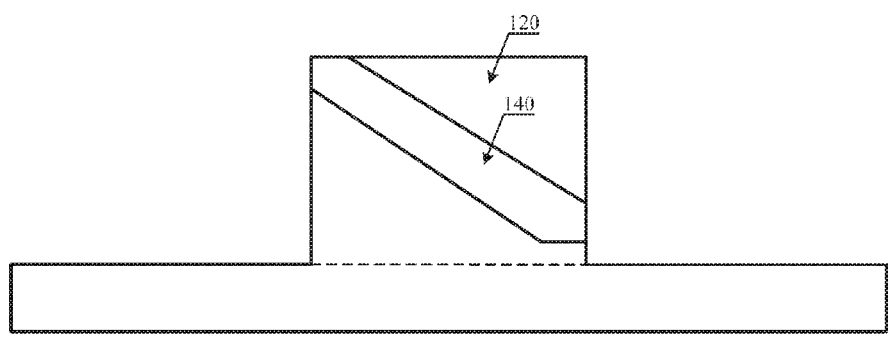
Figure 8:
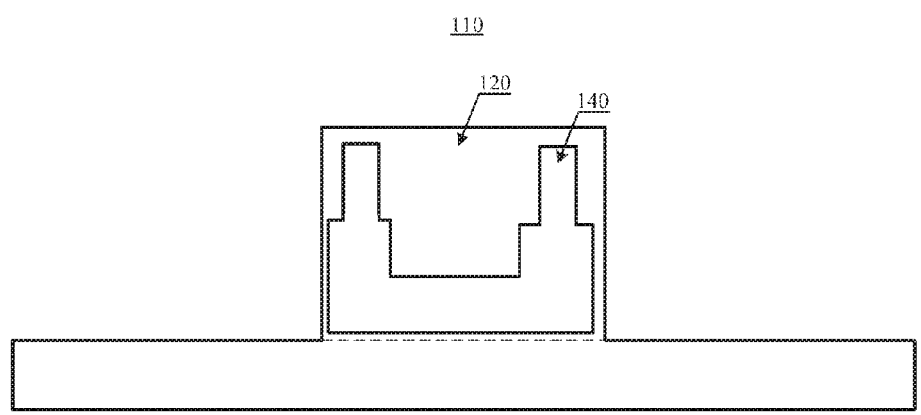

After step 502 ends, the structure of the base substrate 110 may be shown in FIG. 7 or FIG. 8, depending on different shapes of the semiconductor layer 140. In FIG. 7 or FIG. 8, the semiconductor layer 140 is formed on a region over the gate electrode 120 (in a vertical direction on paper). Neither FIG. 7 nor FIG. 8 shows the gate insulating layer.

In step 503, a source electrode and a drain electrode are formed on the base substrate on which the semiconductor layer has been formed. The semiconductor layer is connected to the source electrode and the drain electrode respectively, a first connection region in which a first connection point is located is arranged between the semiconductor layer and the source electrode, and a second connection region in which a second connection point is located is arranged between the semiconductor layer and the drain electrode, a length of a shortest distance on the semiconductor layer from the first connection point to the second connection point being no less than a reference distance which refers to a longest distance of a straight line between any two points among all points on a perimeter of the gate electrode. In addition, projections of the semiconductor layer and the gate electrode on the base substrate have an overlapped area which is less than a projection area of the gate electrode on the base substrate.

It should be noted that after step 503 ends, the array substrate may have two shapes:

The first shape is as shown in FIG. 3, in which the semiconductor layer between the first connection point d1 and the second connection point d2 is of a U-like shape.

Alternatively, the semiconductor layer 140 between the first connection point d1 and the second connection point d2 is narrower at two ends and wider in middle. That is, a width k1 of the first connection region A and the second connection region B is less than a width k2 of other positions of the semiconductor layer 140. Such a shape can reduce an area of the first connection region A connected between the source electrode 150 and the semiconductor layer 140 and reduce an area of the second connection region B connected between the drain electrode 160 and the semiconductor layer 140. Thus, the resistance between the source electrode 150 and the drain electrode 160 may be increased, and the Off-state current may be reduced accordingly.

The second shape is as shown in FIG. 1, in which the semiconductor layer between the first connection point d1 and the second connection point d2 is of a strip shape.

Alternatively, step 502 may include: forming a metallic oxide semiconductor layer on the base substrate on which the gate insulating layer has been formed.

Figure 9:
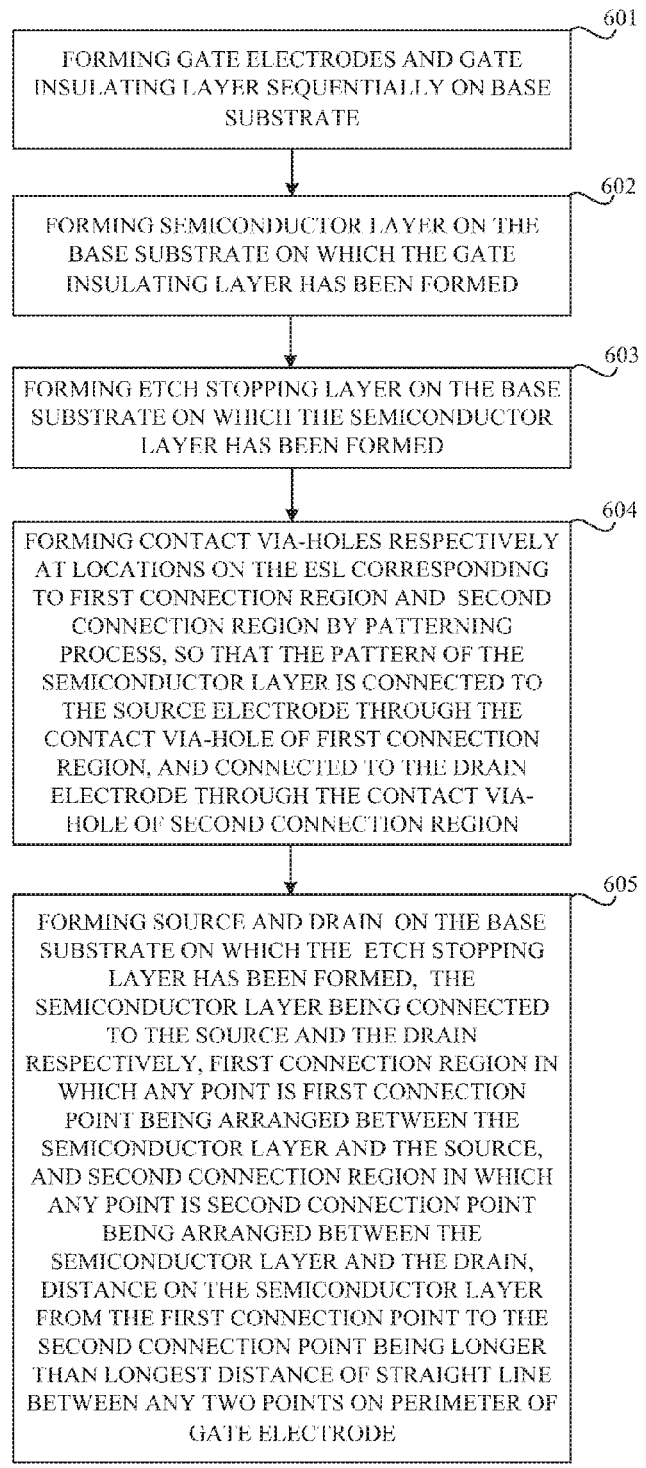
FIG. 9 is a flowchart of another method for manufacturing an array substrate according to an exemplary embodiment of the present disclosure.

Alternatively, FIG. 9 is a flowchart of another method for manufacturing an array substrate according to an exemplary embodiment.

In step 601, a gate electrode and a gate insulating layer are formed sequentially on a base substrate, the gate electrode including a plurality of gate electrodes.

After step 601 ends, the structure of the base substrate 110 may be shown in FIG. 6.

In step 602, a semiconductor layer is formed on the base substrate on which the gate insulating layer has been formed.

After step 602 ends, the structure of the base substrate 110 may be shown in FIG. 7 or FIG. 8, depending on different shapes of the semiconductor layer 140.

In step 603, an etch stopping layer is formed on the base substrate on which the semiconductor layer has been formed.

In step 604, contact via-holes are formed respectively at locations on the etch stopping layer corresponding to the first connection region and the second connection region by a patterning process, so that the semiconductor layer can be connected to the source electrode through the contact via-hole of the first connection region, and connected to the drain electrode through the contact via-hole of the second connection region.

Figure 10:
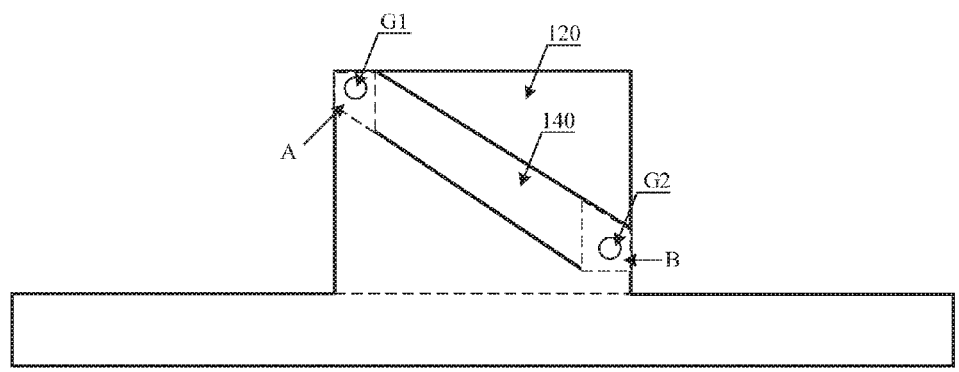
FIGS. 10 and 11 are schematic structure diagrams of array substrates manufactured by the embodiment of the method for manufacturing the array substrate as shown in FIG. 9.
Figure 11:
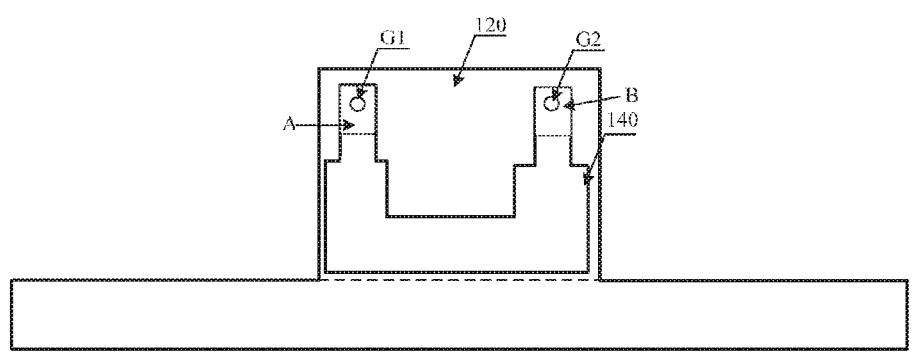

After step 604 ends, the structure of the base substrate 110 may be shown in FIG. 10 or FIG. 11 (in both of which no etch stopping layer is shown). In FIG. 10 or FIG. 11, the semiconductor layer 140 is formed on a region over the gate electrode 120 (in a vertical direction on paper). The contact via-hole G1 is arranged on the first connection region A, and the contact via-hole G2 is arranged on the second connection region B. It should be noted that the first connection region A and the second connection region B are regions predetermined to be connected to the source electrode and the drain electrode respectively.

In step 605, the source electrode and the drain electrode are formed on the base substrate on which the etch stopping layer has been formed. The semiconductor layer is respectively connected to the source electrode and the drain electrode. The first connection region in which a first connection point is located is arranged between the semiconductor layer and the source electrode. The second connection region in which a second connection point is located is arranged between the semiconductor layer and the drain electrode. A length of a shortest distance on the semiconductor layer from the first connection point to the second connection point is no less than a reference distance which refers to a longest distance of a straight line between any two points among all points on a perimeter of the gate. In addition, projections of the semiconductor layer and the gate on the base substrate have an overlapped area which is less than a projection area of the gate on the base substrate.

It should be noted that after step 503 ends, the array substrate may have two shapes:

The first shape is as shown in FIG. 3, in which the semiconductor layer between the first connection point d1 and the second connection point d2 is of a U-like shape.

Alternatively, the semiconductor layer 140 between the first connection point d1 and the second connection point d2 is narrower at two ends and wider in middle. That is, a width k1 of the first connection region A and the second connection region B is less than a width k2 of other positions of the semiconductor layer 140. Such a shape can reduce an area of the first connection region A connected between the source electrode 150 and the semiconductor layer 140 and reduce an area of the second connection region B connected between the drain electrode 160 and the semiconductor layer 140. Thus, the resistance between the source electrode 150 and the drain electrode 160 may be increased, and the Off-state current may be reduced accordingly.

The second shape is as shown in FIG. 1, in which the semiconductor layer between the first connection point d1 and the second connection point d2 is of a strip shape. Further, no contact via-hole has been shown in FIG. 1.

It should be supplemented that the array substrate provided by the present embodiment of the present disclosure increases the resistance between the source electrode and the drain electrode by reducing the area of the first connection region connected between the source electrode and the semiconductor layer and reducing the area of the second connection region connected between the drain electrode and the semiconductor layer, and thus the good effect of reducing the Off-state current may be achieved.

In view of the foregoing, the array substrate provided by the embodiment of the present disclosure solves the problem with the conventional solutions in which with the current Off-state current, the voltage applied across the pixels of the LCD cannot be maintained under the low refresh rate, by increasing the distance between the source electrode and the drain electrode to increase the resistance between the source electrode and the drain electrode and thus to reduce the Off-state current. The good effect of the voltage applied across the pixels of the LCD being able to be maintained even under the low refresh rate may be achieved. Also, the size of the TFT may be efficiently reduced to improve the aperture ratio.

Additionally, the present disclosure also provides a display device. The display device may include the array substrate provided by any of embodiments of the present disclosure, e.g. the array substrate provided by the embodiment as shown in FIG. 1 or the array substrate provided by the embodiment as shown in FIG. 3. The display device may be a display panel, a display, a mobile phone, a TV, a notebook, an all-in-one PC etc. As should be appreciated by the skilled in the art, the display device is also provided with other components necessary to the display device, descriptions of which are omitted and should not be limitation to the present disclosure.

The forgoing description of the embodiments has been provided for purposed of illustration and description. It is not intended to be exhaustive or to limit to that particular embodiment, but, where applicable, are interchangeable and can be used in a selected embodiment, even of not specifically shown or described. The same may also be varied in many ways. Such variations are not to be regarded as a departure from the disclosure, and all such modifications are intended to be included within the scope of the disclosure.

What is claimed is:

1. An array substrate, comprising:
a base substrate;
a gate electrode and a gate insulating layer sequentially formed on the base substrate;
a semiconductor layer formed on the base substrate on which the gate insulating layer has been formed; and
a source electrode and a drain electrode formed on the base substrate on which the semiconductor layer has been formed,
wherein the semiconductor layer is connected to the source electrode and the drain electrode respectively;
wherein a first connection region in which a first connection point is located is arranged between the semiconductor layer and the source electrode;
wherein a second connection region in which a second connection point is located is arranged between the semiconductor layer and the drain electrode; and
wherein a length of a shortest distance on the semiconductor layer from the first connection point to the second connection point is no less than a reference distance which refers to a longest distance of a straight line between any two points among all points on a perimeter of the gate electrode.

2. The array substrate of claim 1, wherein
projections of the semiconductor layer and the gate electrode on the base substrate have an overlapped area which is less than a projection area of the gate electrode on the base substrate.

3. The array substrate of claim 1, wherein
when the gate electrode is of a rectangle, a shortest distance on the semiconductor layer from the first connection point to the second connection point is longer than any of edges of the rectangle.

4. The array substrate of claim 1, wherein
when the gate electrode is of a circle, a shortest distance on the semiconductor layer from the first connection point to the second connection point is longer than a diameter of the circle.

5. The array substrate of claim 1, wherein
when the gate electrode is of an ellipse, a shortest distance on the semiconductor layer from the first connection point to the second connection point is longer than a length of a major axis of the ellipse.

6. The array substrate of claim 1, wherein
when the gate electrode is of a rectangle and the semiconductor layer between the first connection point and the second connection point is of a strip shape, a length direction of the strip is substantially in parallel with a corresponding diagonal of the rectangle.

7. The array substrate of claim 1, wherein
the semiconductor layer between the first connection point and the second connection point is of a U-like shape.

8. The array substrate of claim 1, wherein
the semiconductor layer between the first connection point and the second connection point is narrower at two ends and wider in middle.

9. The array substrate of claim 1, wherein
the semiconductor layer is a metallic oxide semiconductor layer.

10. The array substrate of claim 1, further comprising:
an etch stopping layer (ESL) formed on the base substrate on which the semiconductor layer has been formed;
wherein contact via-holes are respectively formed at locations on the ESL corresponding to the first connection region and the second connection region, and
wherein the semiconductor layer is connected to the source electrode through the contact via-hole of the first connection region, while the semiconductor layer is connected to the drain electrode through the contact via-hole of the second connection region.

11. A method of manufacturing an array substrate, comprising steps of:
forming a gate electrode and a gate insulating layer sequentially on a base substrate;
forming a semiconductor layer on the base substrate on which the gate insulating layer has been formed; and
forming a source electrode and a drain electrode on the base substrate on which the semiconductor layer has been formed,
wherein the semiconductor layer is connected to the source electrode and the drain electrode respectively;
wherein a first connection region in which a first connection point is located is arranged between the semiconductor layer and the source electrode;
wherein a second connection region in which a second connection point is located is arranged between the semiconductor layer and the drain electrode;
wherein a length of a shortest distance on the semiconductor layer from the first connection point to the second connection point is no less than a reference distance which refers to a longest distance of a straight line between any two points among all points on a perimeter of the gate electrode.

12. The method of claim 11, wherein
when the gate electrode is of a rectangle and the semiconductor layer between the first connection point and the second connection point is of a strip shape, a length direction of the strip is substantially in parallel with a corresponding diagonal of the rectangle.

13. The method of claim 11, wherein before the step of forming the source electrode and the drain electrode on the base substrate on which the semiconductor layer has been formed, the method further comprises:
forming an etch stopping layer (ESL) on the base substrate on which the semiconductor layer has been formed; and
forming contact via-holes respectively at locations on the ESL corresponding to the first connection region and the second connection region by a patterning process, so that the semiconductor layer is connected to the source electrode through the contact via-hole of the first connection region, and connected to the drain electrode through the contact via-hole of the second connection region.

14. A display device comprising an array substrate, the array substrate comprising:
a base substrate;
a gate electrode and a gate insulating layer sequentially formed on the base substrate;
a semiconductor layer formed on the base substrate on which the gate insulating layer has been formed; and a source electrode and a drain electrode formed on the base substrate on which the semiconductor layer has been formed, wherein the semiconductor layer is connected to the source electrode and the drain electrode respectively;

wherein a first connection region in which a first connection point is located is arranged between the semiconductor layer and the source electrode;

wherein a second connection region in which a second connection point is located is arranged between the semiconductor layer and the drain electrode; and wherein a length of a shortest distance on the semiconductor layer from the first connection point to the second connection point is no less than a reference distance which refers to a longest distance of a straight line between any two points among all points on a perimeter of the gate electrode.

15. The display device of claim 14, wherein projections of the semiconductor layer and the gate electrode on the base substrate have an overlapped area which is less than a projection area of the gate electrode on the base substrate.

16. The display device of claim 14, wherein when the gate electrode is of a rectangle, a shortest distance on the semiconductor layer from the first connection point to the second connection point is longer than any of edges of the rectangle.

17. The display device of claim 14, wherein when the gate electrode is of a circle, a shortest distance on the semiconductor layer from the first connection point to the second connection point is longer than a diameter of the circle.

18. The display device of claim 14, wherein when the gate electrode is of an ellipse, a shortest distance on the semiconductor layer from the first connection point to the second connection point is longer than a length of a major axis of the ellipse.

19. The display device of claim 14, wherein when the gate electrode is of a rectangle and the semiconductor layer between the first connection point and the second connection point is of a strip shape, a length direction of the strip is substantially in parallel with a corresponding diagonal of the rectangle, and wherein the semiconductor layer between the first connection point and the second connection point is of a U-like shape; or the semiconductor layer between the first connection point and the second connection point is narrower at two ends and wider in middle.

20. The display device of claim 14, wherein the array substrate further comprises:

an etch stopping layer (ESL) formed on the base substrate on which the semiconductor layer has been formed;

wherein contact via-holes are respectively formed at locations on the ESL corresponding to the first connection region and the second connection region;

wherein the semiconductor layer is connected to the source electrode through the contact via-hole of the first connection region;

wherein the semiconductor layer is connected to the drain electrode through the contact via-hole of the second connection region; and wherein the semiconductor layer is a metallic oxide semiconductor layer.

* * * * *